/

US011222691B2

(12) United States Patent
Chien et al.

(10) Patent No.: US 11,222,691 B2
(45) Date of Patent: Jan. 11, 2022

(54) DOUBLE-PITCH-LAYOUT TECHNIQUES AND APPARATUS THEREOF

(71) Applicant: MediaTek Inc., Hsinchu (TW)

(72) Inventors: Tun-Fei Chien, Hsinchu (TW); Chia-Wei Wang, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 16/813,723

(22) Filed: Mar. 9, 2020

(65) Prior Publication Data

US 2021/0280237 A1    Sep. 9, 2021

(51) Int. Cl.
*G11C 11/4093* (2006.01)
*G11C 11/418* (2006.01)
*G11C 11/419* (2006.01)

(52) U.S. Cl.
CPC .......... *G11C 11/418* (2013.01); *G11C 11/419* (2013.01)

(58) Field of Classification Search
CPC ................................. G11C 11/4093
USPC ...................................... 365/230.03
See application file for complete search history.

(56) References Cited

U.S. PATENT DOCUMENTS

| 5,732,030 A | 3/1998 | Dorney |
| 6,141,269 A * | 10/2000 | Shiomi ............... G11C 7/1078 365/200 |
| 6,256,604 B1 * | 7/2001 | Yabe ..................... G11C 5/025 703/14 |
| 7,706,208 B2 | 4/2010 | Takemura et al. |
| 2002/0001215 A1 * | 1/2002 | Fujisawa ............... G11C 5/025 365/51 |
| 2012/0119785 A1 * | 5/2012 | Turner .................... H01L 24/06 326/101 |

FOREIGN PATENT DOCUMENTS

| CN | 1171238 C | 10/2004 |
| WO | WO 2016/081158 A1 | 5/2016 |

* cited by examiner

*Primary Examiner* — Min Huang
(74) *Attorney, Agent, or Firm* — Wolf, Greenfield & Sacks, P.C.

(57) ABSTRACT

Examples pertaining to double-pitch layout techniques in designing a memory circuit layout are described. In a memory circuit, a layout of a first column of M×1 one-bit memory cells of an array of memory cells and a layout of a second column of M×1 one-bit memory cells of the array of memory cells are mirrored in horizontal and vertical axes such that a first group of input/output (I/O) pins, which correspond to the first column of M×1 one-bit memory cells, are on a first side of a layout of the array and the second group of I/O pins, which correspond to the second column of M×1 one-bit memory cells, are on a second side opposite the first side of the layout of the array.

10 Claims, 7 Drawing Sheets

DOUBLE-PITCH-LAYOUT TECHNIQUES AND APPARATUS THEREOF

TECHNICAL FIELD

The present disclosure is generally related to integrated circuit layout of memory circuit and, more particularly, to double-pitch layout techniques in designing a memory circuit layout.

BACKGROUND

Unless otherwise indicated herein, approaches described in this section are not prior art to the claims listed below and are not admitted as prior art by inclusion in this section.

A memory circuit is a critical component that typically occupies relatively large footprint and tends to draw significant power in most integrated circuit technologies. A typical memory circuit such as a static random access memory (SRAM) includes a word-line driver circuit, a control circuit, input/output (I/O) circuits, and an array of one-bit memory cells. The I/O circuits usually include I/O pins, sense amplifier (SA), and a pre-charging circuit. The I/O pins include data-in (DI) pin(s), data-out (DO) pin(s), and BYTE pin(s). A data signal transmitted on a DI pin is to be stored in the memory, a data signal transmitted on a DO pin is to be read out, and a timing control signal transmitted on a BYTE pin indicates the time when the data signal at the DI pin is to be stored. The SA is part of read circuitry of the I/O circuits that is used when data is read from the memory circuit. The SA senses low power signals from a bitline in a memory cell and amplifies small voltage swing(s) on the bitline such that the data can be interpreted properly by logic circuits outside the memory circuit. The pre-charging circuit can pre-charge nodes of the SA prior to reading the memory cell. A typical layout of an M×N array of one-bit memory cells is designed, with M being a positive integer representative of a number of rows and N being a positive integer representative of a number of columns, such that pitches of the I/O pins of the I/O circuits are as small as possible to save areas and costs in fabrication of the memory circuit in integrated circuit technologies. However, the small pitches of the I/O pins of the I/O circuits tend to make the layout or routing of I/O pins to other circuits more difficult. The small pitches of the I/O pins of the I/O circuits in the layout of the memory circuit also cause larger loading capacitances, which can reduce the read/write speed of the memory circuit.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

An objective of the present disclosure is to propose solutions, schemes, concepts, methods and apparatus pertaining to layout techniques used in memory circuits. In particular, the present disclosure aims to provide cost-effective double-pitch layout techniques that re-arrange a layout of a memory circuit. For instance, a proposed scheme in accordance with the present disclosure may relax the tight pitches of I/O pins in I/O circuits of the layout of a memory circuit relative to the pitches of I/O pins of one-bit memory cells while keeping the same memory circuit area. Moreover, the double-pitch layout techniques in accordance with the present disclosure may be extended to multiple pitches of the I/O pins in I/O circuits relative to the pitches of I/O pins of one-bit memory cells in the memory circuit.

In one aspect, an apparatus may include a substrate and a memory circuit on the substrate. The memory circuit may include an array of memory cells, control circuits, a word-line driver, and a plurality of input/output (I/O) circuits. The plurality of I/O circuits may include a plurality of I/O pins comprising at least a first group of I/O pins and a second group of I/O pins. An M×N array of one-bit memory cells of the array of memory cells may be grouped into N/2 two-column pairs of M×1 one-bit memory cells with respective I/O circuits of the plurality of I/O circuits, with M being a positive integer representative of a number of rows and N being a positive integer representative of a number of columns. Each of the two-column pairs of M×1 memory cells may include a first column of M×1 one-bit memory cells and a second column of M×1 one-bit memory cells such that a layout of the first column of M×1 one-bit memory cells and a layout of the second column of M×1 one-bit memory cells may be mirrored in horizontal and vertical axes so that the first group of I/O pins, which correspond to the first column of M×1 one-bit memory cells, may be on a first side of the layout of the array and the second group of I/O pins, which correspond to the second column of M×1 one-bit memory cells, may be on a second side opposite the first side of the layout of the array.

In one aspect, an apparatus may include a memory circuit having an array of memory cells. The array of memory cells may include an M×N array of one-bit memory cells, with M being a positive integer representative of a number of rows and N being a positive integer representative of a number of columns. The M×N array of one-bit memory cells may be grouped into N/2 two-column pairs of M×1 one-bit memory cells. Each of the two-column pairs of M×1 memory cells may include a first column of M×1 one-bit memory cells and a second column of M×1 one-bit memory cells such that a layout of the first column of M×1 one-bit memory cells and a layout of the second column of M×1 one-bit memory cells are mirrored in horizontal and vertical axes.

It is noteworthy that, although description provided herein may be in the context of certain types of memory devices such as SRAM, the proposed concepts, schemes and any variation(s)/derivative(s) thereof may be implemented in, for and by other types of memory devices wherever suitable. Thus, the scope of the present disclosure is not limited to the examples described herein.

BRIEF DESCRIPTION OF THE DRAWINGS

The accompanying drawings are included to provide a further understanding of the disclosure and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED IMPLEMENTATIONS

Detailed embodiments and implementations of the claimed subject matters are disclosed herein. However, it shall be understood that the disclosed embodiments and implementations are merely illustrative of the claimed subject matters which may be embodied in various forms. The present disclosure may, however, be embodied in many different forms and should not be construed as limited to the exemplary embodiments and implementations set forth herein. Rather, these exemplary embodiments and implementations are provided so that description of the present disclosure is thorough and complete and will fully convey the scope of the present disclosure to those skilled in the art. In the description below, details of well-known features and techniques may be omitted to avoid unnecessarily obscuring the presented embodiments and implementations.

Overview

Figure 1:
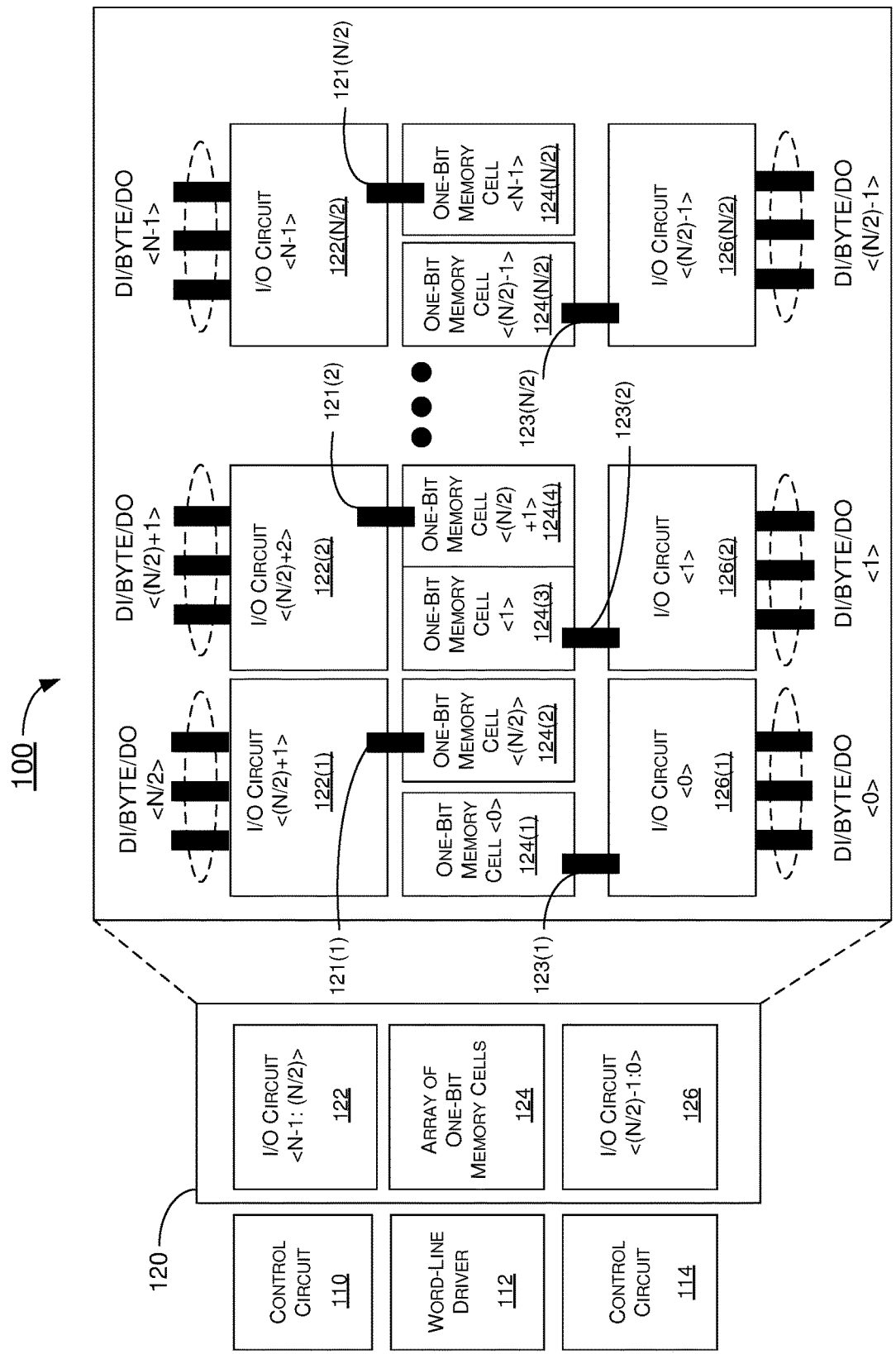
FIG. 1 is a functional diagram of an example memory circuit layout in accordance with an implementation of the present disclosure.

FIG. 1 illustrates a functional diagram of an example memory circuit layout 100 designed with a double-pitch layout technique in accordance with an implementation of the present disclosure. Memory circuit layout 100 may be implemented or otherwise utilized in various integrated circuit technologies. Referring to FIG. 1, memory circuit layout 100 may include a word-line driver 112, controller circuits 110 and 114, an array of one-bit memory cells 124, I/O circuitry 122 (including I/O circuits 122(1)~122(N/2)) and I/O circuitry 126 (including I/O circuits 126(1)~126(N/2)).

Memory circuit layout 100 may include an M×N array of one-bit memory cells of M rows and N columns, which may be arranged into a layout of N/2 two-column pairs of M×1 one-bit memory cells. Here, M may be a positive integer representative of a number of rows, and N may be a positive integer representative of a number of columns. Each of the two-column memory cells may respectively include a first column of M×1 one-bit memory cells and a second column of M×1 one-bit memory cells. A layout of the first column of M×1 one-bit memory cells and a layout of the second column of M×1 one-bit memory cells may be mirrored in horizontal and vertical axes, respectively, such that a first group of I/O circuits 126(1)~126(N/2) of the first column of M×1 one-bit memory cells may be on a first side of the layout of the array while a second group of I/O circuits 122(1)~122(N/2) of the second column of M×1 one-bit memory cells may be on a second side opposite the first side of the layout of the array. In FIG. 1, bit lines of 123(1)~123(N/2) may have bit lines labeled as BL(0), BL(1), . . . , and BL(N/2−1). Similarly, in FIG. 1, bit lines of 121(1)~121(N/2) may have bit lines labeled as BL(N/2), BL(N/2+1), . . . , and BL(N−1).

Thus, in a layout designed with a double-pitch layout technique in accordance with the present disclosure such as layout 100, the pitch may be a two bit-cell pitch as with a MUX-2 I/O pitch. Moreover, in a layout designed with a double-pitch layout technique in accordance with the present disclosure, the I/O circuitry (e.g., I/O circuitry 122 and I/O circuitry 126) may be located at both upper and lower sides of the array of memory cells, with one set of bit lines connected to the I/O circuitry located at the lower side of the array and another set of bit lines connected to the I/O circuitry located at the upper side of the array. Accordingly, the design may result in relaxed pin access as the number of pins per given distance (e.g., micrometer or μm) would be half of that in a conventional design.

Figure 2:
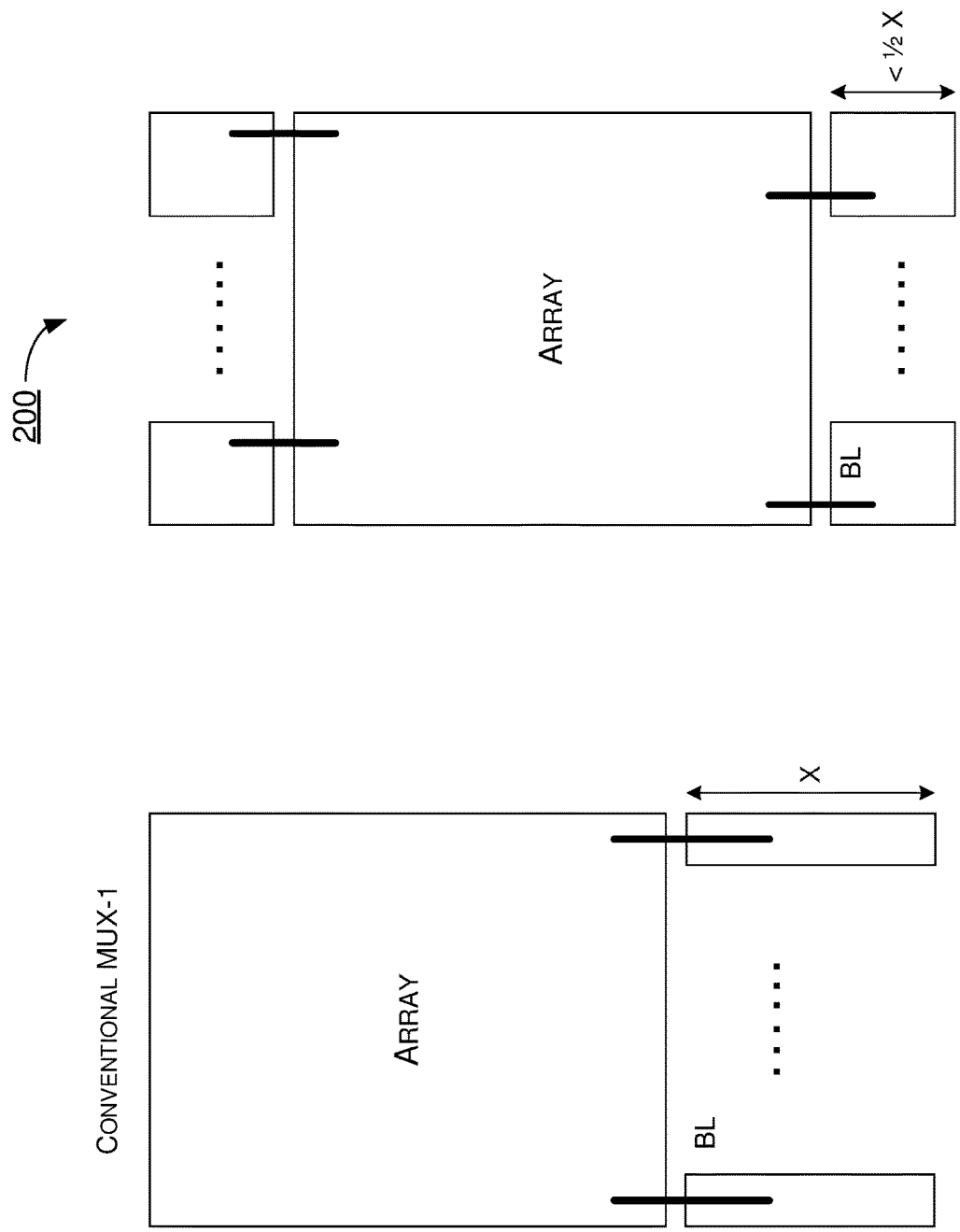
FIG. 2 is a block diagram of an example design in accordance with an implementation of the present disclosure.

FIG. 2 illustrates an example design 200 in accordance with an implementation of the present disclosure. As shown in FIG. 2, compared to a conventional MUX-1 design, design 200 provides a number of benefits. For instance, pin access problem is resolved in design 200 (e.g., with relaxed pin access). Additionally, compared to the conventional MUX-1, design 200 may have a smaller I/O height (e.g., less than ½X versus X) due to relaxed routing resource. Moreover, compared to the conventional MUX-1, design 200 may have a smaller bit line loading.

Design 200 also provides some benefits relative to a conventional MUX-2 design. For instance, design 200 may have a larger I/O supporting range. Moreover, design 200 may have a smaller dynamic power due to no dummy read. Furthermore, compared to a conventional MUX-2, design 200 may have a more compact area or footprint.

Figure 3:
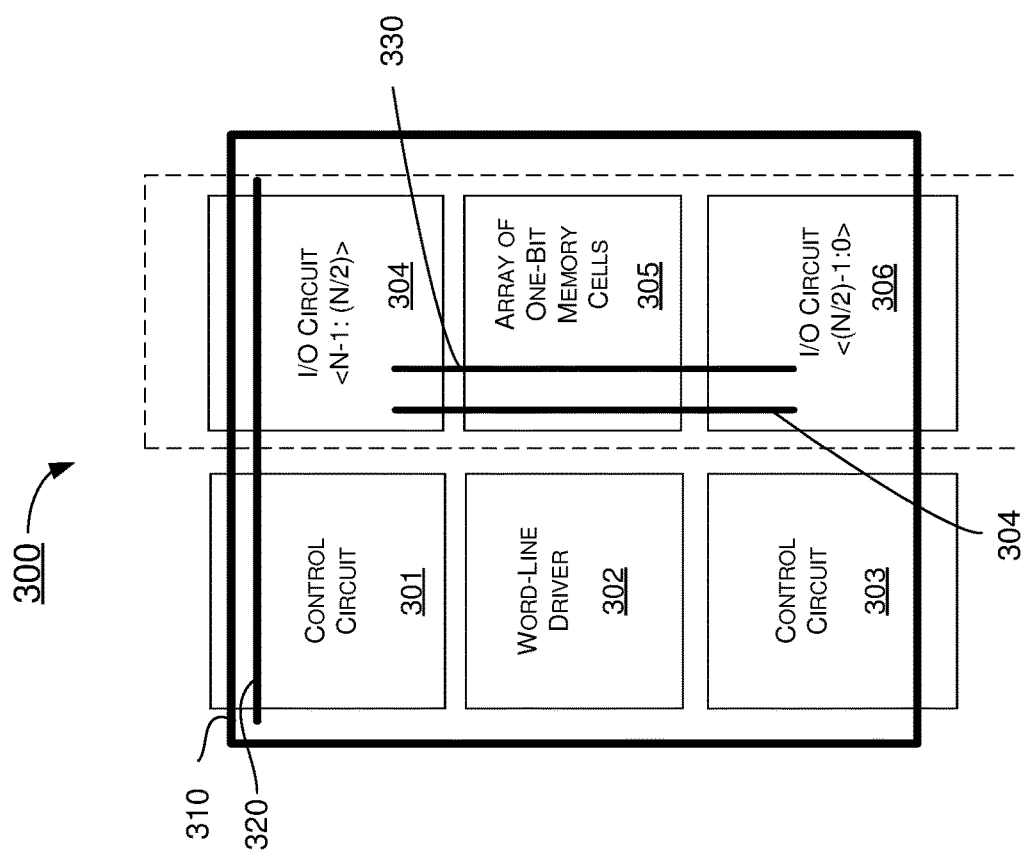
FIG. 3 is a functional diagram of an example floorplan of power bias lines of a memory circuit layout in accordance with an implementation of the present disclosure.

FIG. 3 illustrates a floorplan 300 of power bias lines of a memory circuit designed with a double-pitch layout technique in accordance with an implementation of the present disclosure. Referring to FIG. 3, floorplan 300 may include a power ring 310 and a ground ring 320. Under a proposed scheme in accordance with the present disclosure, internal power mesh of the memory circuit may be implemented as a group of interconnections, power line 330 and ground line 340, with a pitch four times a pitch of I/O pins of a conventional one-bit memory cell.

Accordingly, an I/O pitch under double-pitch layout techniques in accordance with the present disclosure may be a two-bit-cell pitch. Moreover, under double-pitch layout techniques in accordance with the present disclosure, I/O circuits may be located on both sides (e.g., upper side and lower side as shown in FIG. 1 and FIG. 3) of an array, with one bit line routed to the I/O circuits on one side of the array and another bit line routed to the I/O circuits on the opposite side of the array. Thus, it is believed that aforementioned issue with pin access may be addressed by the double-pitch layout techniques in accordance with the present disclosure. Advantageously, relaxed pin access may be achieved since the number of pins for a given amount of area/footprint is halved compared to that of a conventional design. Moreover, a height of the I/O circuits may be reduced due to relaxed routing resource. Furthermore, bitline loading may be reduced as well. Additionally, power supply (e.g., VCC) domain header may be located at both sides (e.g., top side and bottom side) of floorplan 300. Furthermore, floorplan 300 may have an internal power mesh with a group of four-bit-cell pitch.

Figure 4:
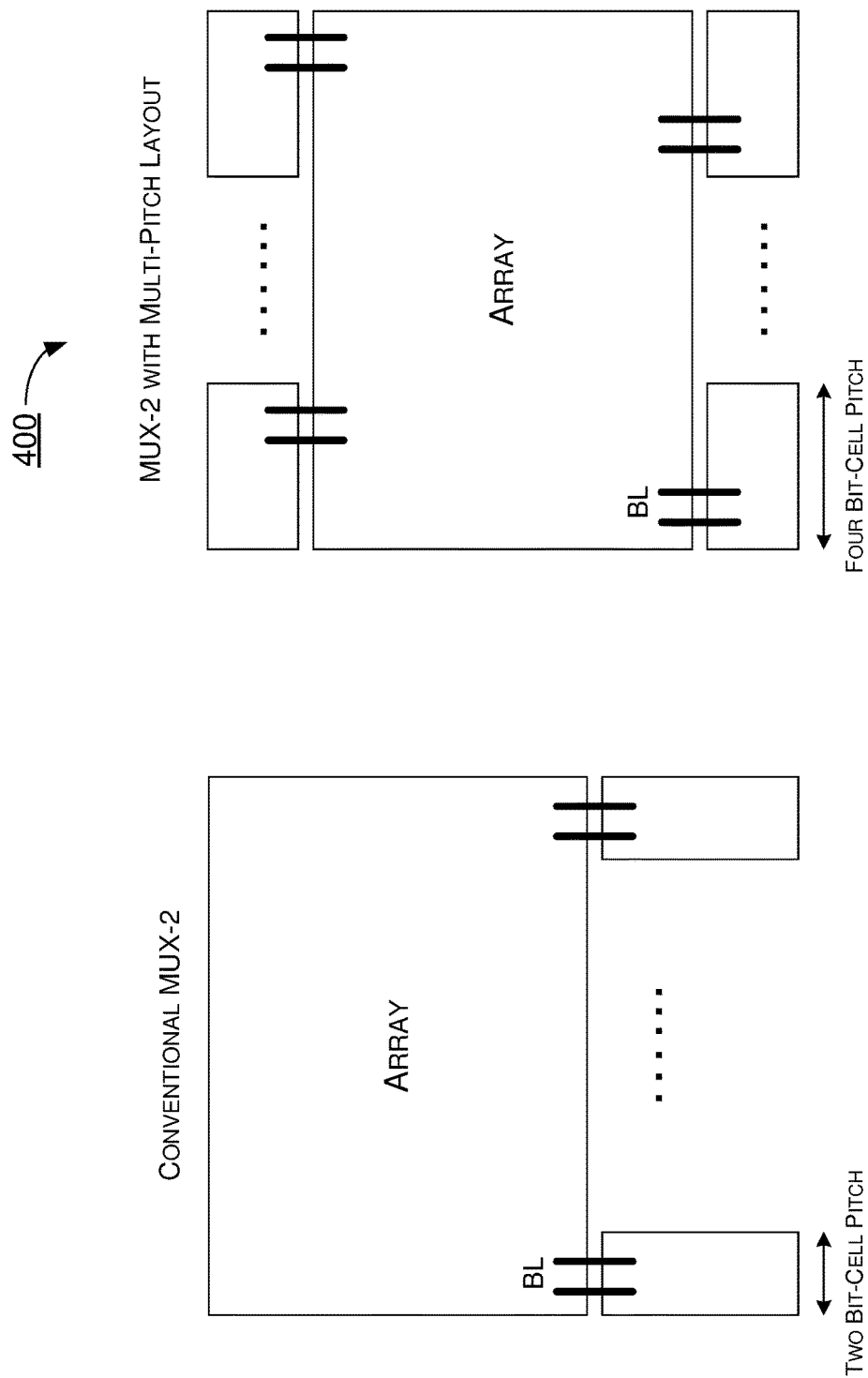
FIG. 4 is a block diagram of an example design in accordance with an implementation of the present disclosure.

FIG. 4 illustrates an example design 400 in accordance with an implementation of the present disclosure. Design 400 may be an extension of design 200 in that the double-pitch layout in design 200 may be extended or expanded to a multi-pitch layout design as in design 400. As shown in FIG. 4, compared to a conventional MUX-2 design having a two-bitch-cell pitch, design 400 may have a four-bit-cell pitch for a MUX-2 structure or an eight-bit-cell pitch for a MUX-4 structure.

Illustrative Implementations

Figure 5:
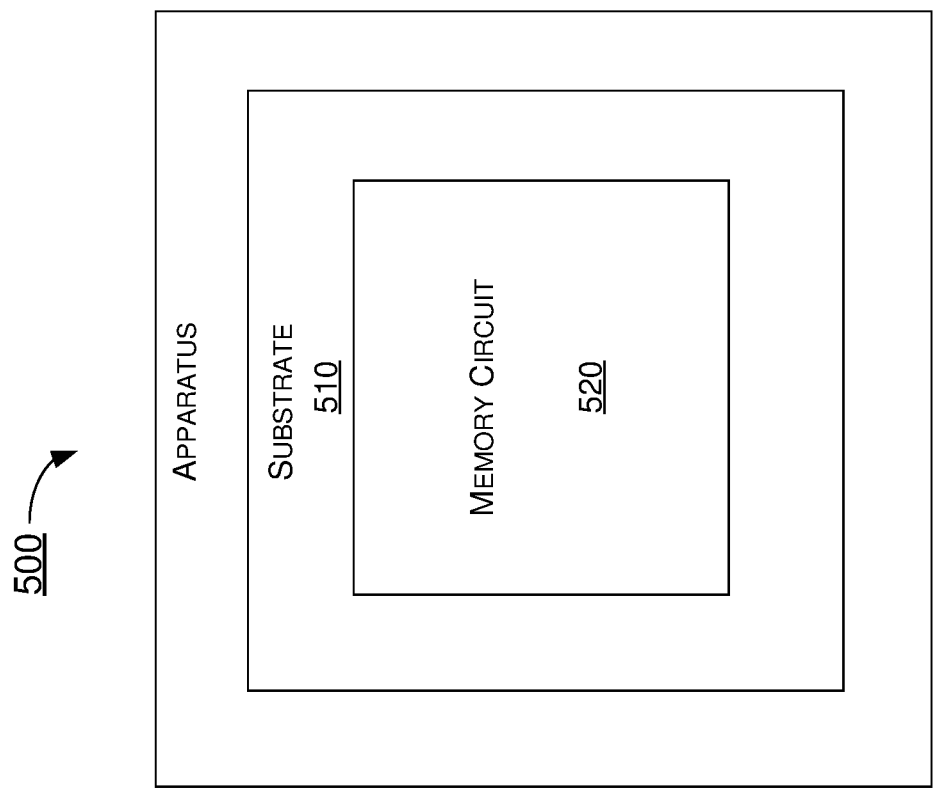
FIG. 5 is a block diagram of an example apparatus in accordance with an implementation of the present disclosure.

FIG. 5 illustrates an example apparatus 500 in accordance with an implementation of the present disclosure. In some implementations, apparatus 500 may include a substrate 510 and a memory circuit 520 on substrate 510. One or more portions of memory circuit 520 may be example implementations of memory circuit layout 100 and floorplan 300 described above. Accordingly, features of memory circuit layout 100 and floorplan 300 as described above are applicable to memory circuit 520.

Memory circuit 510 may include an M×N array of one-bit memory cells, control circuits, a word-line driver, and I/O circuits. The I/O circuits may include a plurality of I/O pins. A layout of the M×N array of one-bit memory cells and the I/O circuits may be grouped into N/2 two-column pairs of M×1 one-bit memory cells with respective I/O circuits. Here, M may be a positive integer representative of a number of rows, and N may be a positive integer representative of a number of columns. Each of the two-column pairs of M×1 one-bit memory cells may include a first column of M×1 one-bit memory cells 124(n) and a second column of M×1 one-bit memory cells 124(n+1). Here, n may range from 1 to (N/2). Thus, a layout of the first column of M×1 one-bit memory cells and a layout of the second column of M×1 one-bit memory cells may be mirrored in horizontal and vertical axes such that a first group of I/O pins of the first column of M×1 one-bit memory cells with respective I/O circuits may be on a first side of the layout of the array. Moreover, a second group of I/O pins of the second column of M×1 one-bit memory cells with respective I/O circuits may be on a second side opposite the first side of the layout of the array.

Figure 6:
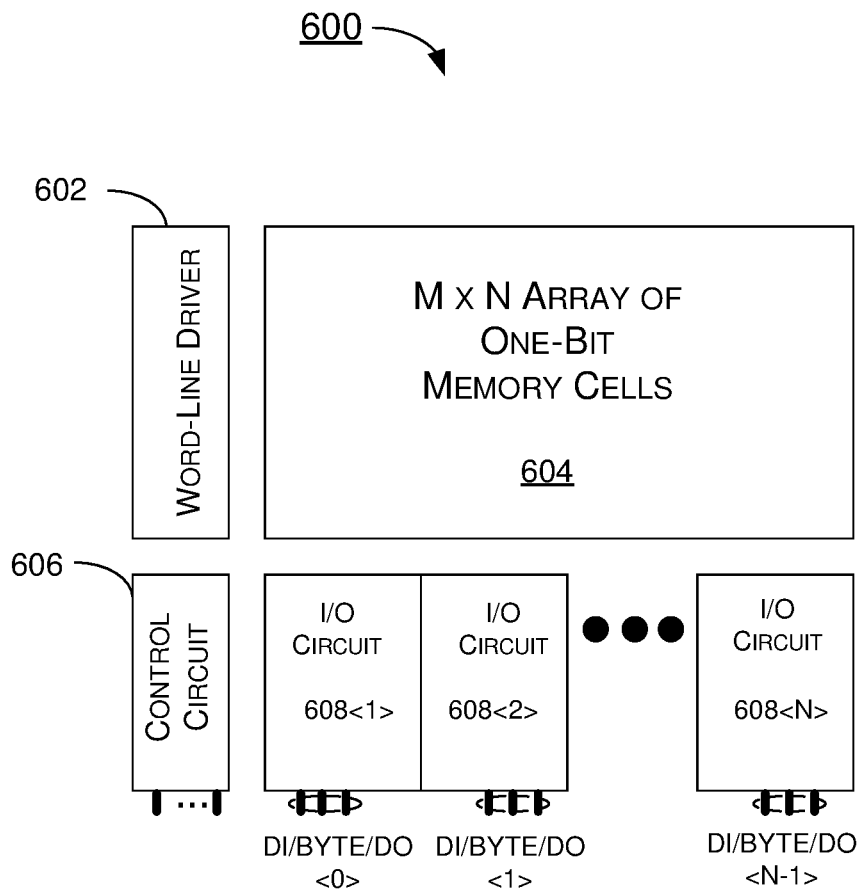
FIG. 6 is a functional diagram of a conventional memory circuit layout.
Figure 7:
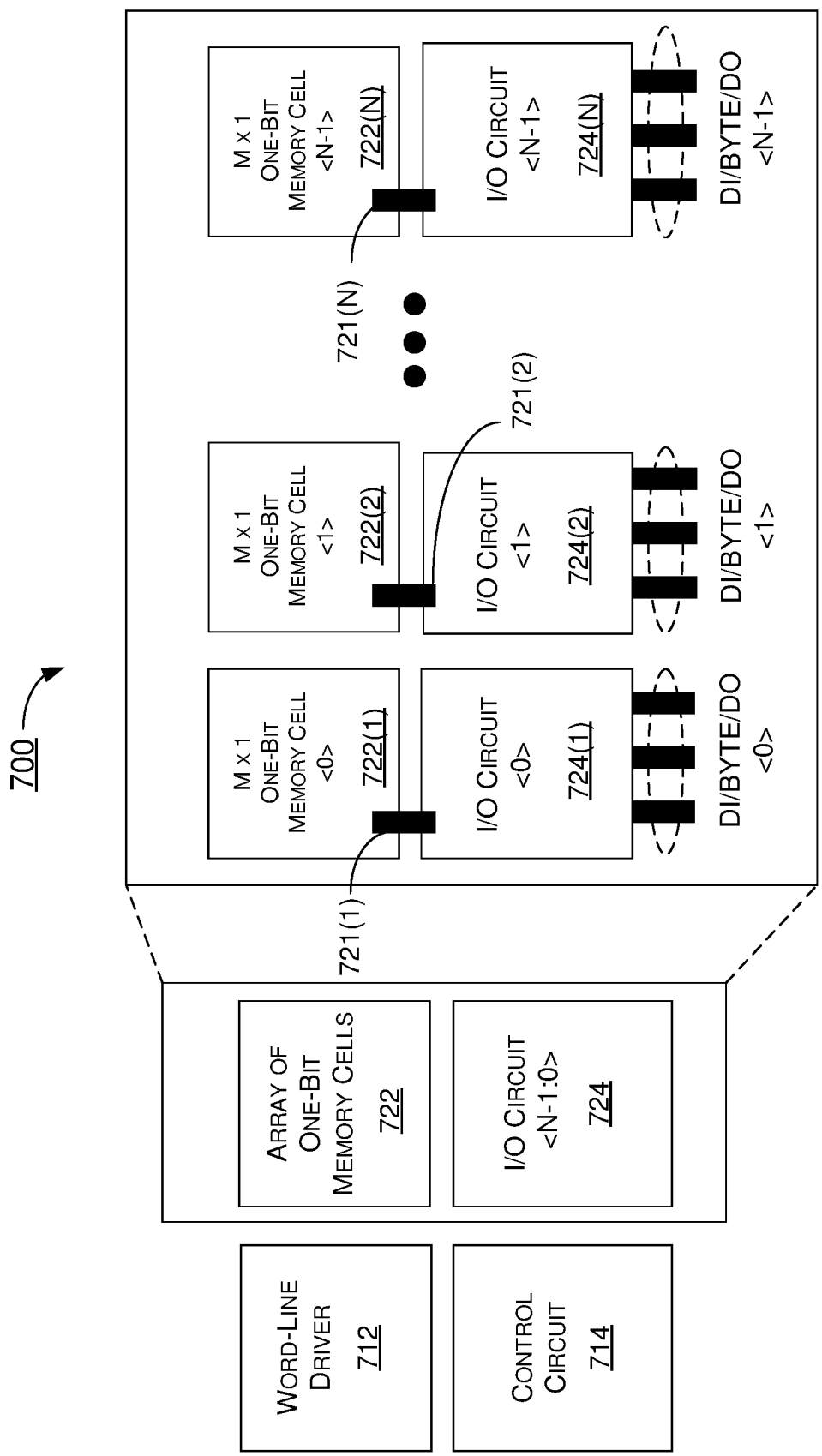
FIG. 7 is a functional diagram of a conventional memory circuit layout.

For illustrative and comparative purposes, each of FIG. 6 and FIG. 7 illustrates an example conventional memory circuit layout 600 and memory circuit layout 700, respectively. Referring to FIG. 6, memory circuit layout 600 includes a control circuit 606, a word-line driver 602, an M×N array of one-bit memory cells 604, and an array of I/O circuits 608<1>~608<N>, with M being a positive integer representative of a number of rows and N being a positive integer representative of a number of columns. The I/O pins of the one-bit memory cells 604 are all located on one side of memory circuit layout 600. Referring to FIG. 7, memory circuit layout 700 includes 5a word-line driver 712, a control circuit 714, an N columns of M×1 one-bit memory cells 722(1) 722(N), and respective I/O circuits 724<1>!724<N>, with M being a positive integer representative of a number of rows and N being a positive integer representative of a number of columns. The I/O pins of the one-bit memory cells, DI/BYTE/DO<0>~DI/BYTE/DO<N−1>, are all located on one side of memory circuit layout 700. The bit lines of 721(1)~721(N) have bit lines labeled as BL(0), BL(1), . . . , and BL(N−1).

In view of the above, a memory circuit layout designed with a double-pitch layout technique in accordance with the present disclosure may be summarized as below. In the memory circuit layout, an M×N array of one-bit memory cells may be into N/2 two-column pairs of M×1 one-bit memory cells with respective I/O circuits. Here, M may be a positive integer representative of a number of rows and N may be a positive integer representative of a number of columns. Referring to FIG. 1, the layout of an M×N array of one-bit memory cells may include a first column of M×1 one-bit memory cells 124(n) and a second column of M×1 one-bit memory cells 124(n+1). Here, index n may range from 1 to (N/2. Thus, a layout of the first column of M×1 one-bit memory cells and a layout of the second column of M×1 one-bit memory cells may be mirrored in horizontal and vertical axes such that the first group of I/O pins of the first column of M×1 one-bit memory cells are on a first side of the layout of the array and the second group of I/O pins of the second column of M×1 one-bit memory cells are on a second side opposite the first side of the layout of the array.

Additionally, the layout of the first column of M×1 one-bit memory cell and the layout of the second column M×1 one-bit memory cell may be adjacent each other. Each of the I/O control circuits may include data-in (DI) pin(s), data-out (DO) pin(s), and BYTE pin(s). Accordingly, pitches of the plurality of I/O pins of the I/O circuits may be equal to twice that of a pitch of I/O pins of one-bit memory cells. Alternatively, or additionally, the layout of the first column of M×1 one-bit memory cell and the layout of the second column M×1 one-bit memory cell may be adjacent each other. Accordingly, a width of the first column memory cell may be one half of a width of a corresponding I/O circuit. Similarly, a width of the layout of the second column memory cell may be one half of a width of a corresponding I/O circuit.

Highlight of Features

In view of the above, select features of examples utilizing the double-pitch layout techniques in accordance with the present disclosure are highlighted below.

In one aspect, an apparatus may include a substrate and a memory circuit on the substrate. The memory circuit may include an array of memory cells, control circuits, a word-line driver, and a plurality of input/output (I/O) circuits. The plurality of I/O circuits may include a plurality of I/O pins comprising at least a first group of I/O pins and a second group of I/O pins. An M×N array of one-bit memory cells of the array of memory cells may be grouped into N/2 two-column pairs of M×1 one-bit memory cells with respective I/O circuits of the plurality of I/O circuits, with M being a positive integer representative of a number of rows and N being a positive integer representative of a number of columns. Each of the two-column pairs of M×1 memory cells may include a first column of M×1 one-bit memory cells and a second column of M×1 one-bit memory cells such that a layout of the first column of M×1 one-bit memory cells and a layout of the second column of M×1 one-bit memory cells may be mirrored in horizontal and vertical axes so that the first group of I/O pins, which correspond to the first column of M×1 one-bit memory cells, may be on a first side of the layout of the array and the second group of I/O pins, which correspond to the second column of M×1 one-bit memory cells, may be on a second side opposite the first side of the layout of the array.

In some implementations, the plurality of I/O circuits may include I/O pins comprising data-in (DI) pins, data-out (DO) pins, and BYTE pins. In some implementations, pitches of the I/O pins may be equal to twice of a pitch of each of the one-bit memory cells.

In some implementations, the plurality I/O circuits of the two-column memory cell may be located on the first side and the second side of the layout.

In some implementations, the plurality of I/O circuits may include a pre-charging circuitry and a sense amplifier (SA).

In some implementations, the memory circuit may also include one additional control circuit that functions as a global signal buffer.

In some implementations, the memory circuit may also include power switches located on the first side of the layout and the second side of the layout. In some implementations, the power switches may control a power bias of the memory circuit.

In some implementations, the memory circuit may also include an internal power mesh. In some implementations, a pitch of the internal power mesh may be four times a pitch of corresponding I/O pins of each of the one-bit memory cells.

In some implementations, layouts of the M×N array of one-bit memory cells and the plurality of I/O circuits may be grouped into N/4 of four-column groups of M×1 memory cells. Each of the two-column pairs of M×1 memory cells may include a first column of M×1 one-bit memory cells, a second column of M×1 one-bit memory cells, a third column of M×1 one-bit memory cells, and a fourth column of M×1 one-bit memory cells such that layouts of the first column, second column, third column and fourth column of M×1 one-bit memory cells may be mirrored in horizontal and vertical axes so that a first set of I/O pins corresponding to the first column of M×1 one-bit memory cells and a third set of I/O pins corresponding to the third column of M×1 one-bit memory cells may be on the first side of the layout of the array, and a second set of I/O pins corresponding to the second column of M×1 one-bit memory cells and a fourth set of I/O pins corresponding to the fourth column of M×1 one-bit memory cells may be on the second side of the layout of the array.

In some implementations layouts of the M×N array of one-bit memory cells and the I/O circuits may be grouped into N/P of P columns of M×1 one-bit memory cells, with P being a positive integer such that layouts of the P columns of M×1 one-bit memory cells may be mirrored in horizontal and vertical axes so that the first group of I/O pins may be on the first side of the layout of the array and the second group of I/O pins may be on the second side of the layout of the array.

In one aspect, an apparatus may include a memory circuit having an array of memory cells. The array of memory cells may include an M×N array of one-bit memory cells, with M being a positive integer representative of a number of rows and N being a positive integer representative of a number of columns. The M×N array of one-bit memory cells may be grouped into N/2 two-column pairs of M×1 one-bit memory cells. Each of the two-column pairs of M×1 one-bit memory cells may include a first column of M×1 one-bit memory cells and a second column of M×1 one-bit memory cells such that a layout of the first column of M×1 one-bit memory cells and a layout of the second column of M×1 one-bit memory cells may be mirrored in horizontal and vertical axes.

In some implementations, the apparatus may also include a first group of input/output (I/O) pins and a second group of I/O pins. For each of the two-column pairs of M×1 memory cells, the first group of I/O pins, which correspond to the first column of M×1 one-bit memory cells, may be on a first side of the layout of the array of memory cells and the second group of I/O pins, which correspond to the second column of M×1 one-bit memory cells, may be on a second side of the layout of the array opposite the first side thereof.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. An apparatus, comprising:
   a substrate; and
   a memory circuit on the substrate, the memory circuit comprising an array of memory cells, control circuits, a word-line driver, and a plurality of input/output (I/O) circuits, the plurality of I/O circuits comprising a plurality of I/O pins comprising at least a first group of I/O pins and a second group of I/O pins, wherein:
   an M×N array of one-bit memory cells of the array of memory cells are grouped into N/2 two-column pairs of M×1 one-bit memory cells with respective I/O circuits of the plurality of I/O circuits, with M being a positive integer representative of a number of rows and N being a positive integer representative of a number of columns,
   each of the two-column pairs of M×1 memory cells comprises a first column of M×1 one-bit memory cells and a second column of M×1 one-bit memory cells,
   a layout of the first column of M×1 one-bit memory cells and a layout of the second column of M×1 one-bit memory cells are mirrored in horizontal and vertical axes such that the first group of I/O pins, which correspond to the first column of M×1 one-bit memory cells, are on a first side of the layout of the array and the second group of I/O pins, which correspond to the second column of M×1 one-bit memory cells, are on a second side opposite the first side of the layout of the array,
   wherein the memory circuit further comprises an internal power mesh, and wherein a pitch of the internal power mesh is four times a pitch of corresponding I/O pins of each of the one-bit memory cells.

2. The apparatus of claim 1, wherein, wherein the plurality of I/O circuits comprise I/O pins comprising data-in (DI) pins, data-out (DO) pins, and BYTE pins, and wherein pitches of the I/O pins are equal to twice of a pitch of each of the one-bit memory cells.

3. The apparatus of claim 1, wherein the plurality I/O circuits are located on the first side and the second side of the layout.

4. The apparatus of claim 1, wherein the plurality of I/O circuits comprise a pre-charging circuitry and a sense amplifier (SA).

5. The apparatus of claim 1, wherein the memory circuit further comprises one additional control circuit that functions as a global signal buffer.

6. The apparatus of claim 1, wherein the memory circuit further comprises power switches located on the first side of the layout and the second side of the layout, and wherein the power switches control a power bias of the memory circuit.

7. The apparatus of claim 1, wherein layouts of the M×N array of one-bit memory cells and the plurality of I/O circuits are grouped into N/4 of four-column groups of M×1 memory cells, wherein:
   each of the two-column pairs of M×1 memory cells comprises a first column of M×1 one-bit memory cells, a second column of M×1 one-bit memory cells, a third column of M×1 one-bit memory cells, and a fourth column of M×1 one-bit memory cells,
   layouts of the first column, second column, third column and fourth column of M×1 one-bit memory cells are mirrored in horizontal and vertical axes such that a first set of I/O pins corresponding to the first column of M×1 one-bit memory cells and a third set of I/O pins corresponding to the third column of M×1 one-bit memory cells are on the first side of the layout of the array, and a second set of I/O pins corresponding to the second column of M×1 one-bit memory cells and a fourth set of I/O pins corresponding to the fourth column of M×1 one-bit memory cells are on the second side of the layout of the array.

8. The apparatus of claim 1, wherein layouts of the M×N array of one-bit memory cells and the I/O circuits are grouped into N/P of P columns of M×1 one-bit memory cells, with P being a positive integer, wherein:
   layouts of the P columns of M×1 one-bit memory cells are mirrored in horizontal and vertical axes such that the first group of I/O pins are on the first side of the layout of the array and the second group of I/O pins are on the second side of the layout of the array.

9. An apparatus, comprising:
   a memory circuit comprising an array of memory cells, the array of memory cells comprising an M×N array of one-bit memory cells, with M being a positive integer representative of a number of rows and N being a positive integer representative of a number of columns, wherein:
   the M×N array of one-bit memory cells are grouped into N/2 two-column pairs of M×1 one-bit memory cells, and
   each of the two-column pairs of M×1 memory cells comprises a first column of M×1 one-bit memory cells and a second column of M×1 one-bit memory cells such that a layout of the first column of M×1 one-bit memory cells and a layout of the second column of M×1 one-bit memory cells are mirrored in horizontal and vertical axes,
   wherein the memory circuit further comprises an internal power mesh, and wherein a pitch of the internal power mesh is four times a pitch of corresponding I/O pins of each of the one-bit memory cells.

10. The apparatus of claim 9, further comprising:
    a first group of input/output (I/O) pins; and
    a second group of I/O pins,
    wherein, for each of the two-column pairs of M×1 memory cells, the first group of I/O pins, which correspond to the first column of M×1 one-bit memory cells, are on a first side of the layout of the array of memory cells and the second group of I/O pins, which correspond to the second column of M×1 one-bit memory cells, are on a second side of the layout of the array opposite the first side thereof.

* * * * *